(12) United States Patent
Steinhoff

(10) Patent No.: US 11,094,614 B2
(45) Date of Patent: Aug. 17, 2021

(54) SEMICONDUCTOR CHIP CONTACT STRUCTURE, DEVICE ASSEMBLY, AND METHOD OF FABRICATION

(71) Applicant: Littelfuse, Inc., Chicago, IL (US)

(72) Inventor: Stefan Steinhoff, Somerset (GB)

(73) Assignee: Littelfuse, Inc., Chicago, IL (US)

( * ) Notice: Subject to any disclaimer, the term of this patent is extended or adjusted under 35 U.S.C. 154(b) by 106 days.

(21) Appl. No.: 16/578,648

(22) Filed: Sep. 23, 2019

(65) Prior Publication Data

US 2021/0090972 A1    Mar. 25, 2021

(51) Int. Cl.

| | |
|---|---|
| *H01L 23/48* | (2006.01) |
| *H01L 29/66* | (2006.01) |
| *H01L 29/78* | (2006.01) |
| *H01L 29/739* | (2006.01) |
| *H01L 29/861* | (2006.01) |

(52) U.S. Cl.
CPC ...... *H01L 23/481* (2013.01); *H01L 29/66204* (2013.01); *H01L 29/66325* (2013.01); *H01L 29/66522* (2013.01); *H01L 29/66674* (2013.01); *H01L 29/7394* (2013.01); *H01L 29/7801* (2013.01); *H01L 29/861* (2013.01)

(58) Field of Classification Search
CPC ............. H01L 23/481; H01L 29/66204; H01L 29/66325; H01L 29/66522; H01L 29/66674; H01L 29/7394; H01L 29/7801
See application file for complete search history.

(56) References Cited

U.S. PATENT DOCUMENTS

| | | | | |
|---|---|---|---|---|
| 2014/0211438 | A1* | 7/2014 | Lin | ........................ H01L 23/525 361/767 |
| 2016/0043054 | A1* | 2/2016 | Fischer | ................... H01L 25/18 438/107 |
| 2019/0206824 | A1* | 7/2019 | Lu | ......................... H01L 23/481 |
| 2019/0326255 | A1* | 10/2019 | Olson | ..................... H01L 24/94 |
| 2019/0348510 | A1* | 11/2019 | Yilmaz | ............... H01L 29/0696 |

* cited by examiner

*Primary Examiner* — Christine A Enad
(74) *Attorney, Agent, or Firm* — Kacvinsky Daisak Bluni PLLC

(57) ABSTRACT

A semiconductor device structure may include a semiconductor device, disposed at least in part in a semiconductor substrate, and a first insulator layer, disposed on a surface of the semiconductor device, and comprising a first contact aperture, disposed within the first insulator layer. The semiconductor device structure may also include a first contact layer, comprising a first electrically conductive material, disposed over the insulator layer, and being in electrical contact with the semiconductor device through the first contact aperture, and a second insulator layer, disposed over the first contact layer, wherein the second insulator layer further includes a second contact aperture, displaced laterally from the first contact aperture, by a first distance. The semiconductor device structure may further include a second contact layer, comprising a second electrically conductive material, disposed over the second insulator layer, and electrically connected to the semiconductor device through the first and second contact aperture.

9 Claims, 4 Drawing Sheets

SEMICONDUCTOR CHIP CONTACT STRUCTURE, DEVICE ASSEMBLY, AND METHOD OF FABRICATION

BACKGROUND

Field

Embodiments relate to the field of semiconductor devices, and in particular, power semiconductor chips.

Discussion of Related Art

Present day power semiconductor devices, including insulated gate bipolar transistors (IGBT) or diode power modules may be arranged in semiconductor die (chips) be designed for use in high voltage and high power scenarios with voltage ranging up to 7 kV or more and current up to 3 kA or more. Metallization for contacting such chips may include a layer of an AlSi alloy or similar alloy for directly contacting a silicon die. Press pack modules are arranged to provide electrical contact to a set of semiconductor die by abutting a set of external electrically conductive structures against the set of semiconductor die and applying mechanical pressure between the external electrically conductive structures and the set of semiconductor die to establish good electrical contact. To facilitate proper electrical contact, further metal layers such as aluminum may be provided on top of the alloy layer in the semiconductor die.

Notably, the introduction of additional metal layers on a semiconductor die may introduce complications, including unwanted interaction of the additional metal layer with the underlying semiconductor die. For example, insulated gate bipolar transistor (IGBT) power chips used for press pack applications may need an additional thick and soft metallization layer to form a robust press pack connection, in addition to an underlying metallization, typically an AlSi or AlSiCu alloy. In between the two metallization layers, an insulating layer may be placed to serve as an etch stop, shaping the current density at the edges and giving mechanical support to the overall metallization structure. The insulating layer presents an opening to provide an electrical path between the two metallization layers, reaching to the underlying substrate.

A problem may occur when this metal stack, arranged on a semiconductor chip, such as an emitter region of an IGBT, is exposed to a significant thermal budget. For example, in a subsequent polymer curing step (polyimide curing, for example), the thermal budget may be significant enough to generate damage of the emitter when silicon atoms migrate from the semiconductor substrate and are dissolved in the overlying metallization layers. This damage may be manifested in deterioration of electrical characteristics (VCESAT, Vp, Eon, and so forth).

In view of the above, the present embodiments are provided.

BRIEF SUMMARY

In one embodiment a semiconductor device structure is provided. The semiconductor device structure may include a semiconductor device, disposed at least in part in a semiconductor substrate. The semiconductor device structure may further include a first insulator layer, disposed on a surface of the semiconductor device, and comprising a first contact aperture, disposed within the first insulator layer. The semiconductor device structure may also include a first contact layer, comprising a first electrically conductive material, disposed over the insulator layer, and being in electrical contact with the semiconductor device through the first contact aperture. The semiconductor device structure may further include a second insulator layer, disposed over the first contact layer, wherein the second insulator layer further includes a second contact aperture, displaced laterally from the first contact aperture, by a first distance. The semiconductor device structure may further include a second contact layer, comprising a second electrically conductive material, disposed over the second insulator layer, wherein the second contact layer is electrically connected to the semiconductor device through the first contact aperture and the second contact aperture.

In another embodiment, a semiconductor device assembly may include a device carrier and a plurality of semiconductor substrates, arranged in an array on a surface of the device carrier, wherein a given semiconductor substrate of the plurality of semiconductor substrates comprises a semiconductor device, disposed at least in part within the given semiconductor substrate. The given semiconductor substrate may further include a first insulator layer, disposed on a surface of the semiconductor device, and comprising a first contact aperture, disposed within the first insulator layer, and a first contact layer, comprising a first electrically conductive material, disposed over the first insulator layer, and being in electrical contact with the semiconductor device through the first contact aperture. The given semiconductor substrate may also include a second insulator layer, disposed over the first contact layer, wherein the second insulator layer further includes a second contact aperture, displaced laterally from the first contact aperture, by a first distance. The given semiconductor substrate may also include a second contact layer, comprising a second electrically conductive material, disposed over the second insulator layer, wherein the second contact layer is electrically connected to the semiconductor device through the first contact aperture and the second contact aperture.

In a further embodiment, a method of forming a semiconductor device assembly is provided. The method may include depositing a first insulator layer on an active region of at least one semiconductor device, the at least one semiconductor device disposed at least partially within a semiconductor substrate. The method may also include patterning the first insulator layer to form a set of first apertures, over the active region, and forming a first contact layer on the first insulator layer, wherein the first contact layer is electrically connected to the active region via the set of first apertures. The method may include forming a second insulator layer over the first contact layer, patterning the second insulator layer to form a set of second apertures, laterally displaced from the set of first apertures, and forming a second contact layer on the second insulator layer, wherein the second contact layer is electrically connected to the active region of the at least one semiconductor device via the set of first apertures and the set of second apertures.

DESCRIPTION OF EMBODIMENTS

Figure 1A:
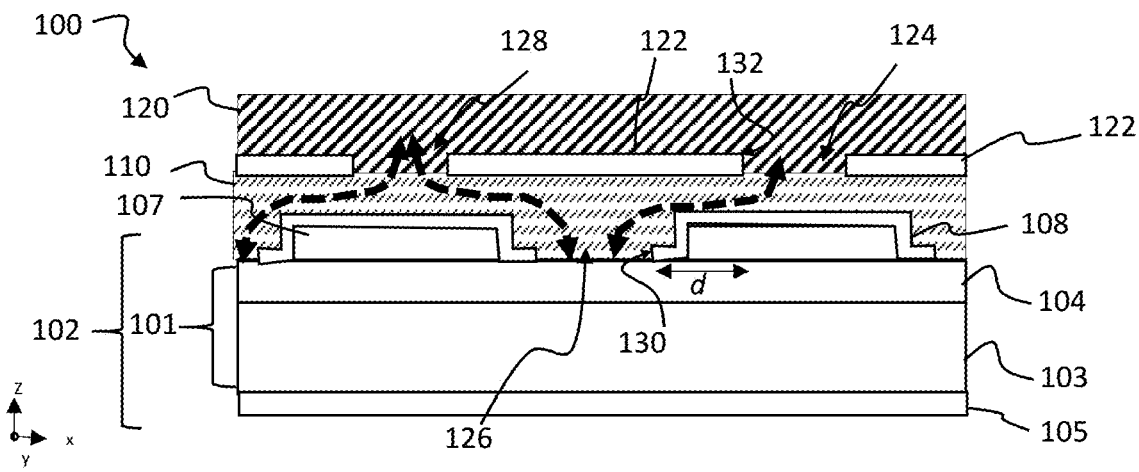
FIG. 1A shows a semiconductor device package in side cross-sectional view, in accordance with various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a semiconductor device structure and semiconductor device package and techniques for assembly are provided for power semiconductor devices.

Turning to FIG. 1A there is shown a side cross-sectional view of a semiconductor device structure 100, in accordance with embodiments of the disclosure. The semiconductor device structure 100 may be embodied in a semiconductor die as known in the art, such as a silicon die or similar semiconductor die. In various embodiments, a semiconductor device 102 is formed in the semiconductor substrate 101. According to various embodiments the semiconductor device 102 may be an insulated gate bipolar transistor (IGBT) metal oxide semiconductor field effect transistor (MOSFET), semiconductor diode, or other semiconductor device. The semiconductor device 102 may be formed of multiple layers and multiple different structures, as known in the art, where a layer 103 and layer 104 are shown for purposes of illustration, while not limited to any particular device structure. The semiconductor device 102 may include additional features such as a gate structure 107, disposed on a surface of the semiconductor substrate 101.

According to various embodiments, the semiconductor device structure 100 may further include a contact structure to facilitate external electrical contact to the semiconductor device 102. For example, in the case of an IGBT, a top surface region, represented by the layer 104, may contain an emitter or source structure. As such, electrical contact to the top surface of the semiconductor device structure 100 provides an emitter contact to form an emitter terminal, as generally known in the art. As shown in FIG. 1A, the semiconductor device structure 100 may include a first insulator layer 108 disposed on a surface of the semiconductor device 102, and comprising a first contact aperture 126, disposed within the first insulator layer 108. In an embodiment of an IGBT, as suggested in FIG. 1A, a gate structure 107 (not shown in detail) may be disposed under at least a part of the first insulator layer 108.

The device structure 100 may also include a first contact layer 110, comprising a first electrically conductive material, disposed over the first insulator layer 108, including conductive material being disposed over or through the first contact aperture 126. As such, the first contact layer 110 may be in electrical contact with the semiconductor device 102 through the first contact aperture 126.

In addition to the first contact layer 110, a second insulator layer 122 may be provided, disposed over the first contact layer 110, wherein the second insulator layer 122 further includes a second contact aperture 124, displaced laterally from the first contact aperture 126, by a first distance, d. In particular, the displacement of nearest edge 132 of the second contact aperture 124 with respect to the nearest edge 130 of the first contact aperture 126 is denoted by d.

The semiconductor device structure 100 may further include a second contact layer 120, comprising a second electrically conductive material, disposed over the second insulator layer 122, wherein the second contact layer 120 is electrically connected to the semiconductor device 102 through the first contact aperture 126 and the second contact aperture 124. As shown in FIG. 1A, a conductive path 128 is provided between second contact layer 120 and semiconductor device 102, as shown by the broken arrows. Accordingly, external electrical contact to the semiconductor device 102 may be accomplished by contacting the top of second contact layer.

Figure 1B:
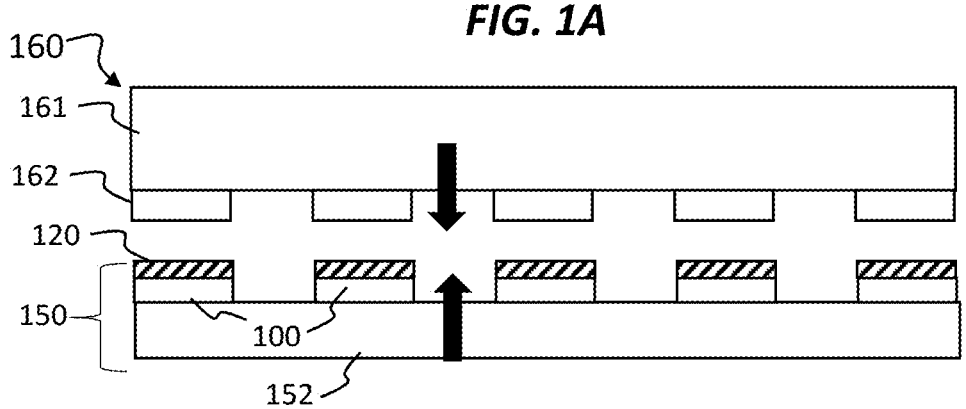
FIG. 1B presents a side view of a semiconductor device package, according to embodiments of the disclosure.

According to various embodiments of the disclosure the semiconductor device structure 100 may be used in high voltage, high current applications, where multiple semiconductor die are packaged in a given assembly to increase current carrying capability and/or voltage capacity. In some examples, the semiconductor device structure 100 may be used in a so-called press-pack application. As an example, FIG. 1B presents a side view of a semiconductor device assembly 150, according to embodiments of the disclosure. The semiconductor device assembly 150 includes a device carrier 152, which carrier may be formed of a known substrate, such as a conductive carrier, to support a plurality of semiconductor substrates, arranged in an array on the surface of the device carrier 152. The semiconductor die are represented by semiconductor device structure 100, described above. As such, the semiconductor die may be arranged in arrays having several die, or up to many dozens of die in some embodiments. Advantageously, to provide proper electrical contact to the semiconductor device structure 100, the second contact layer 120 may be formed of a soft metal having sufficient thickness to account for variations in height of semiconductor die (semiconductor substrate), or variation in height of contact pillars 162 of external contacting device 160. For example, the second contact layer 120 may be formed of an aluminum layer having a layer thickness in the range of 5 μm to 10 μm.

In some embodiments, the semiconductor device assembly 150 may include a metal plate that electrically connects all the semiconductor die to one another. For example, referring again to FIG. 1A, the semiconductor device structure 100 may include a backside contact layer 105, such as a collector contact, forming a collector terminal, in the case of an IGBT device.

In addition, the external contacting device 160 may include a conductive plate 161 that forms electrical contact with all the semiconductor die via copper structures, acting as the contact pillars 162. For example a copper plate may be provided so that an array of copper pillars contact the copper plate or are integrally formed from the copper plate. The copper pillars may present flat surfaces to create uniform contact with the second contact layer 120, when the copper pillars and copper plate are clamped to the plurality of semiconductor substrates of the semiconductor device assembly 150.

In some implementations, a further contact structure, such as a metal insert in the form of a foil or plate, such as a molybdenum plate, may be provided between the contact pillars 162 and the semiconductor device structures 100. Additionally, in some non-limiting embodiments, an additional molybdenum plate may be provided between the backside contact layer 105 and a conductive plate of the device carrier 152.

In various embodiments, in addition to IGBT die, other type of semiconductor die may be assembled together on the device carrier 152. Thus, a semiconductor device assembly may include a plurality of IGBT, all of one kind, and a plurality of diodes, coupled with the IGBT die, also all of one kind. In some embodiments, IGBT chips made of one semiconductor material, such as Si, and diode chips made of another semiconductor material such as SiC may be provided on the device carrier 152.

Advantageously, by providing the layer structure as shown, including the second insulator layer 122, a relatively thick contact structure may be formed in a mechanically stable configuration above the semiconductor device 102. Moreover, by providing a staggered configuration of contact apertures, where the first contact aperture 126 is displaced laterally from the second contact aperture 124, the path between semiconductor device 102 and second contact layer 120 may be established at a sufficient remove to prevent unacceptable interdiffusion between second contact layer 120 and semiconductor device 102.

For example, according to different non-limiting embodiments, the width of the gate-emitter-cell structure may be in the range of 10 µm to 30 µm, the pitch between the cells-may range up to 150 µm or so, while the first distance d, representing the lateral distance between first contact aperture 126 and the second contact aperture 124, may be in the range of 10 µm to 50 µm Notably, the long direction of the cell or cell length (along the Y-axis) may extend for the whole chip's active area, up to 7 mm-10 mm or so, in various non-limiting embodiments.

Referring to FIG. 1A, the conductive path 128 may also approximate a minimum diffusion path between diffusing species diffusing from layer 104 to second contact layer 120. Accounting for a lateral displacement of 10 µm to 50 µm, meaning the distance between nearest edge of the first contact aperture 126 with respect to nearest edge of the second contact aperture, the length of the diffusion path may accordingly range from somewhat greater than 10 µm to somewhat greater than 50 µm in some embodiments.

Figure 1C:
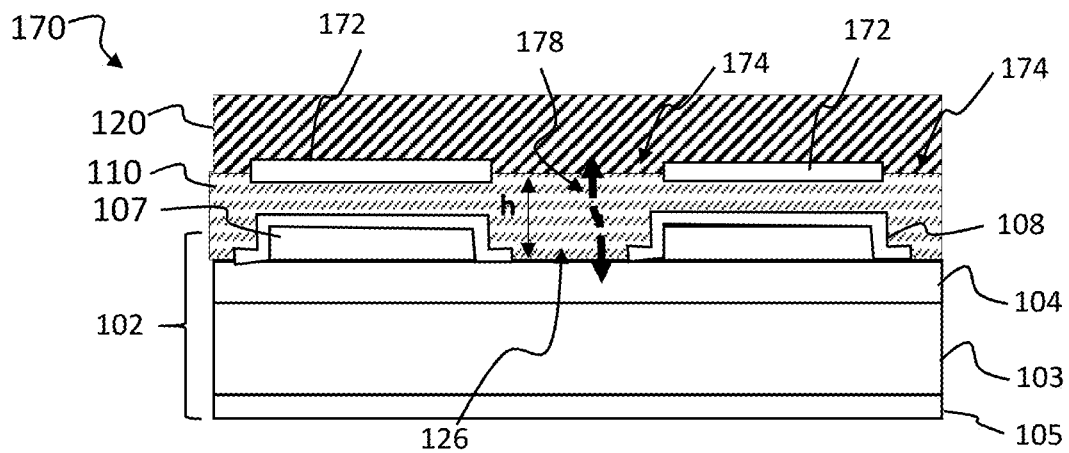
FIG. 1C presents a side cross-sectional view of a reference device structure.

This configuration may present a more robust configuration as compared to a reference configuration, shown in FIG. 1C. In the configuration of FIG. 1C, the semiconductor device structure 170 is arranged similarly to the semiconductor device structure 100, except as otherwise noted. In the semiconductor device structure 170, a second insulator layer 172 is provided where apertures 174 are aligned directly above first contact apertures 126. While this arrangement may seem to provide a more direct conductive path or diffusion path, compared to the conductive path 128 in FIG. 1A, the path 178 between layer 104 and second contact layer 120 may be much less, nearly equivalent to the thickness h of the first contact layer 110, which thickness may be in the range of just 2 µm to 5 µm in various embodiments. Such a close separation may risk unacceptable diffusion from the layer 104 depending upon processing conditions.

Notably, it has been observed that defects tend to be generated in the surface regions of device structures, arranged generally as the semiconductor device structure 170, when such device structures are subjected to thermal treatment, such as annealing treatment used to cure polyimide structures. Notably, in structures where the top aperture is omitted it was observed that no such defects were observed after similar thermal treatment.

Without being bound by any particular theory, the appearance of the defects in the structure of FIG. 1C after thermal treatment may be due to excess diffusion of silicon species from the semiconductor device 102, which device was formed of monocrystalline silicon in the region of first contact aperture 126. After leaving the semiconductor device 102 the silicon species may diffuse into the second contact layer 120, which layer was formed of highly pure aluminum, as noted. Notably, the aluminum layer may act as a diffusion sink for mobile silicon atoms that become more prevalent when the semiconductor device structure 170 is subjected to thermal treatment, such as polyimide curing. Because the distance between the layer 104 (monocrystalline silicon in these experiments) and the second contact layer 120 is just 3 or 4 µm, the diffusion sink is accordingly just 3 or 4 µm removed from a source of silicon atoms, thus promoting the diffusion of silicon into the second contact layer 120, causing the resulting defects.

On the other hand, in the device structure of FIG. 1A, the second insulator layer 122 blocks silicon atoms from diffusing into portions of the diffusion sink (second contact layer 120) located directly above the first contact aperture 126 where the underlying monocrystalline is exposed. Moreover, the diffusion sink (second contact layer 120) is open to diffusing silicon species just in the second contact apertures 124, displaced laterally from the first contact aperture 126, so the diffusion sink is much more remote from the diffusion source (first contact aperture 126 region). Said differently, any mobile silicon atoms leaving the surface of layer 104 through first contact aperture 126 find a much longer diffusion path to reach the diffusion sink through the second contact aperture 124, such as >10 µm to >30 µm.

Figure 2A:
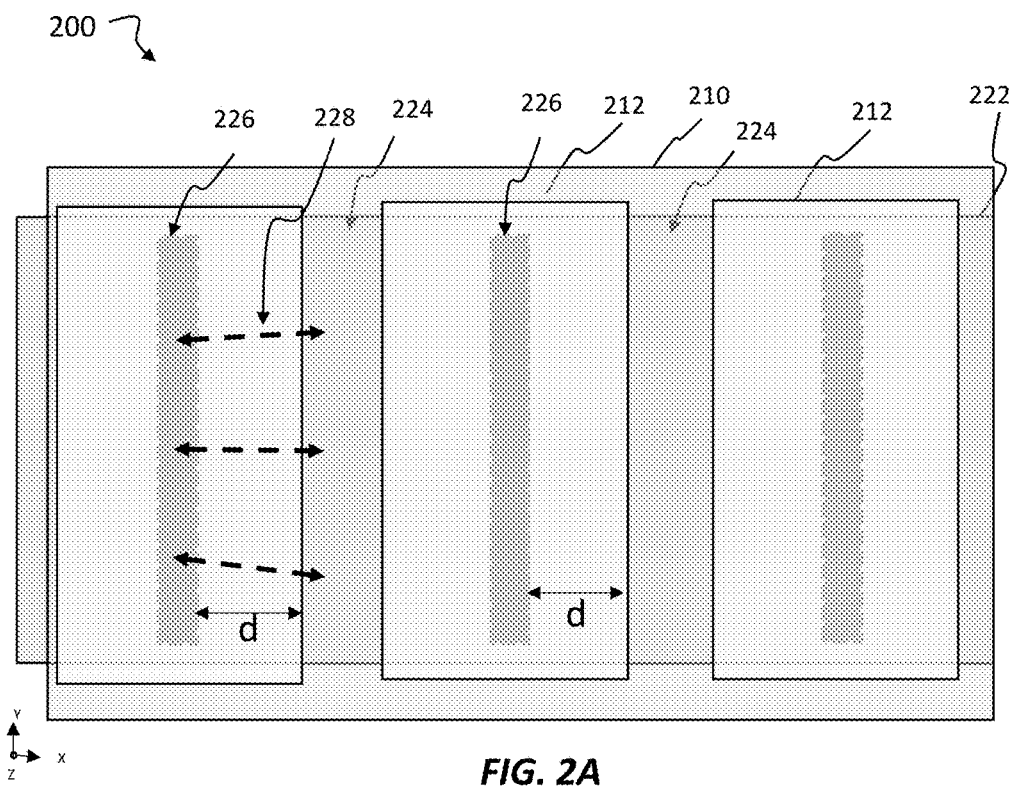
FIG. 2A and FIG. 2B show a semiconductor device structure in top plan view and side cross-sectional view, respectively, according to embodiments of the disclosure.
Figure 2B:
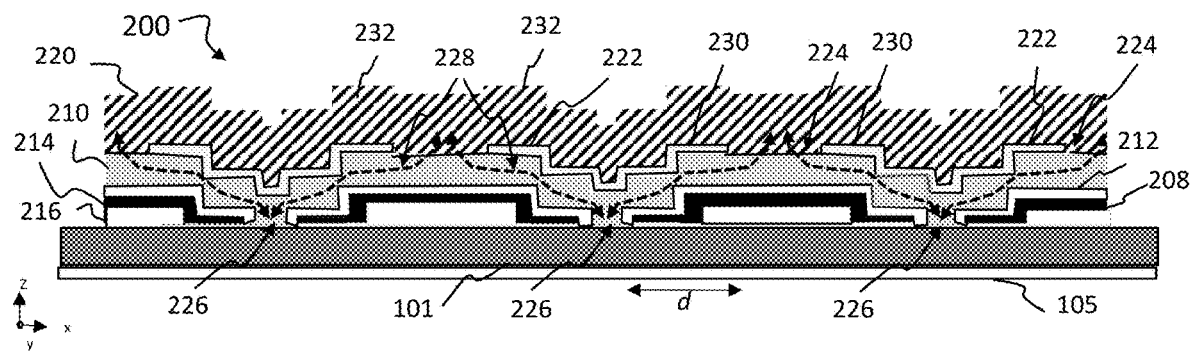

Turning to FIG. 2A and FIG. 2B there is shown a semiconductor device structure 200 in top plan view and side cross-sectional view, respectively, according to embodiments of the disclosure. In this embodiment of the disclosure the semiconductor device structure 200 is arranged according to the basic principles of FIG. 1A, where a first insulator layer 212 is disposed over a surface of the semiconductor device 102. The first insulator layer includes a plurality of lower contact apertures, shown as first apertures 226, where a first contact layer 210 is in electrical contact with the semiconductor device 102. As shown in the embodiment of FIG. 2A, the first apertures 226 may be arranged as striped regions, elongated along a first direction, and mutually parallel to one another. The semiconductor device structure 200 further includes a second insulator layer 222, disposed over the first contact layer 210, where the second insulator layer 222 further includes a plurality of upper contact apertures, shown as second apertures 224, also arranged as striped regions, elongated along the first direction, in a mutually parallel fashion. A second contact layer 220 is disposed over the second insulator layer 222, and forms electrical contact with the first contact layer 210 through the second apertures 224. The paths 228 may represent electrically conductive paths or alternatively diffusion paths for species diffusing between semiconductor device 102 and second contact layer 220. In this arrangement, the lateral displacement d may be set to a suitable distance to prevent or minimize diffusion during thermal treatment of species such as silicon from the semiconductor device 102 into the second contact layer 220, such as aluminum.

As shown in FIG. 2B various structures within semiconductor device structure 200 may have a non-planar topology. The structures 208 may be formed by depositing a polysilicon layer 214 over a mesa 216 of field oxide and gate oxide as known in the art. As such, the structures 208 may have a generally mesa-shape where a width along the X-axis (of the Cartesian coordinate system shown), formed by a gate oxide and a polysilicon layer, may extend for 5 µm to 20 µm and a height along the Z-axis may extend for 0.5 µm to 2 µm above the underlying semiconductor device 102 in some non-limiting embodiments. The first insulator layer 212 may according form a non-planar coating over the underlying structures, as shown in FIG. 2B. Similarly, the first contact layer 210, having a thickness in the range of 2 µm to 5 µm in some embodiments, may tend to form over the underlying structures in a non-planar manner shown. Likewise, the second insulator layer 222 may extend over the first contact layer 210 in a non-planar manner as shown. As suggested in FIG. 2B, the highest regions of the second insulator layer 222 may tend to position over the tallest portions of the structures 208. Moreover, the second contact layer 220 may also form in a non-planar fashion so that the highest regions 232 of the second contact layer 220 are arranged over the structures 208. The regions 232 will tend be the regions of the second contact layer 220 that actually form physical contact with an external contact. To support these regions of the second contact layer 220 to provide stable contact to outside structures, the second insulator layer 222 plays a useful role. Thus, in some implementations, the width (along the _X axis) of the regions 230 of second insulator layer 222 may be increased relatively, such as by arranging a relatively smaller aperture size for second apertures 224. For example, where the width of the field oxide is 20 µm, and the thickness of the first contact layer 210 is 4 µm, the width of second apertures 224 may be set at 8 µm, to allow sufficient size to not unduly limit current, while providing an effective width for regions 232 of approximately 6 µm on each side.

Notably, the aforementioned embodiments illustrate a portion of a semiconductor die and a semiconductor device, while omitting certain other regions. In particular, the figures may show just active device areas of a chip, while in other areas the first insulator layer and/or second insulator layer may generally cover the underlying substrate in blanker fashion without any apertures.

Moreover, in other embodiments, a semiconductor device may be arranged according to a cell design having arrays of squares or polygonal shaped cells, or grids of linear cells.

Figure 3:
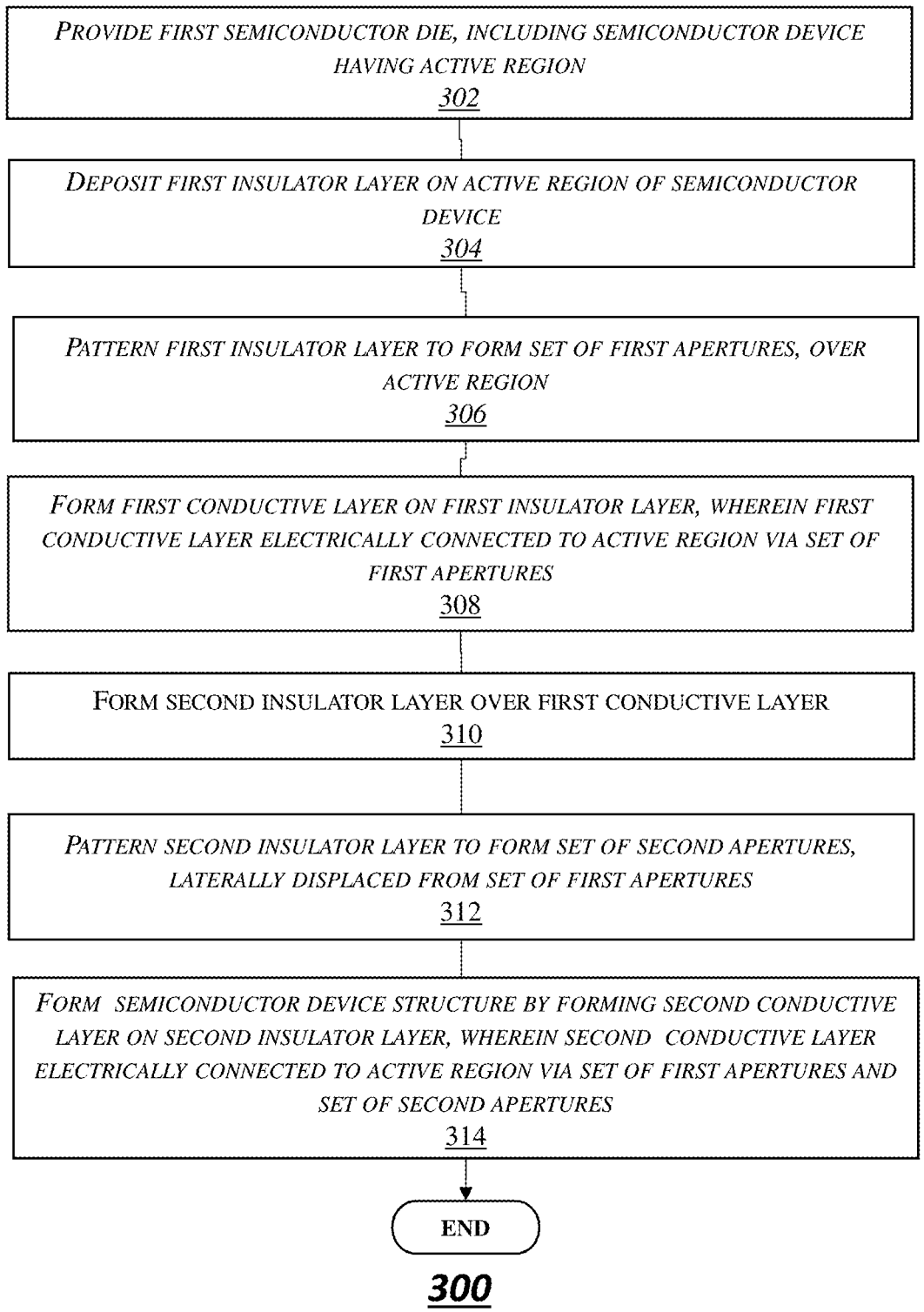
FIG. 3 depicts a first process flow, according to embodiments of the disclosure.

Turning to FIG. 3 there is shown a process flow 300, according to embodiments of the disclosure. At block 302 a first semiconductor die is provided. The first semiconductor die may be a monocrystalline silicon die and may include a semiconductor device having an active region, such as an IGBT, MOSFET, diode, or other device.

At block 304, a first insulator layer is deposited over the active region of the semiconductor device. In some examples, the first insulator may be deposited over the entire die. Suitable materials for the first insulator layer include silicon oxide, silica glass, including doped silicon glass, phosphosilicate glass (PSG), a multilayer stack, and so forth. The embodiments are not limited in this context.

At block 306, the first insulator layer is patterned to form a set of first apertures, over the active region. The patterning may be performed by any suitable known technique, such as lithographic patterning and etching of select regions of the insulator layer. Examples of an active region that is exposed by the set of first apertures include a surface layer of a monocrystalline substrate, where the surface layer forms part of a semiconductor device to be contacted, such as an emitter of an IGBT. The set of first apertures may have any suitable shape, and may be arranged in any suitable pattern, such as an array of striped regions to name one non-limiting embodiments.

At block 308 a first contact layer is formed over the first insulator layer. The first contact layer may be deposited in blanket fashion over the first insulator layer so as to cover the set of first apertures, wherein the first contact layer is electrically connected to the active region via the set of first apertures. For example the first contact layer may be formed of a suitable metal alloy such as AlSi, to form contact with a doped silicon region of the semiconductor die.

At block 310, a second insulator layer is formed over the first contact layer. The second insulator layer may be deposited over the entire die in some embodiments. Suitable materials for the second insulator layer include silicon nitride. The embodiments are not limited in this context.

At block 312, the second insulator layer is patterned to form a set of second apertures, laterally displaced from the set of first apertures. In other words, with respect to the set of first apertures, the set of second apertures may be shifted a predetermined distance within a plane of the substrate lying parallel to a main surface of the semiconductor die. As such, the set of second apertures may not overlap above the set of first apertures, and may be laterally shifted by many micrometers with respect to the set of first apertures, such as 10 micrometers to 50 micrometers in some non-limiting embodiments.

At block 314, a semiconductor device structure is created by forming a second contact layer on the second insulator layer. The second contact layer may be formed of a suitable material such as aluminum, according to one non-limiting embodiment. The second contact layer may be formed at a suitable thickness to provide proper electrical contact when the semiconductor device structure is contacted, such as when assembled on a carrier in a multi-device array along with like semiconductor device structures for contacting by a press pack assembly. As such, the thickness of the second contact layer may range from 5 µm to 10 µm in various non-limiting embodiments.

Figure 4:
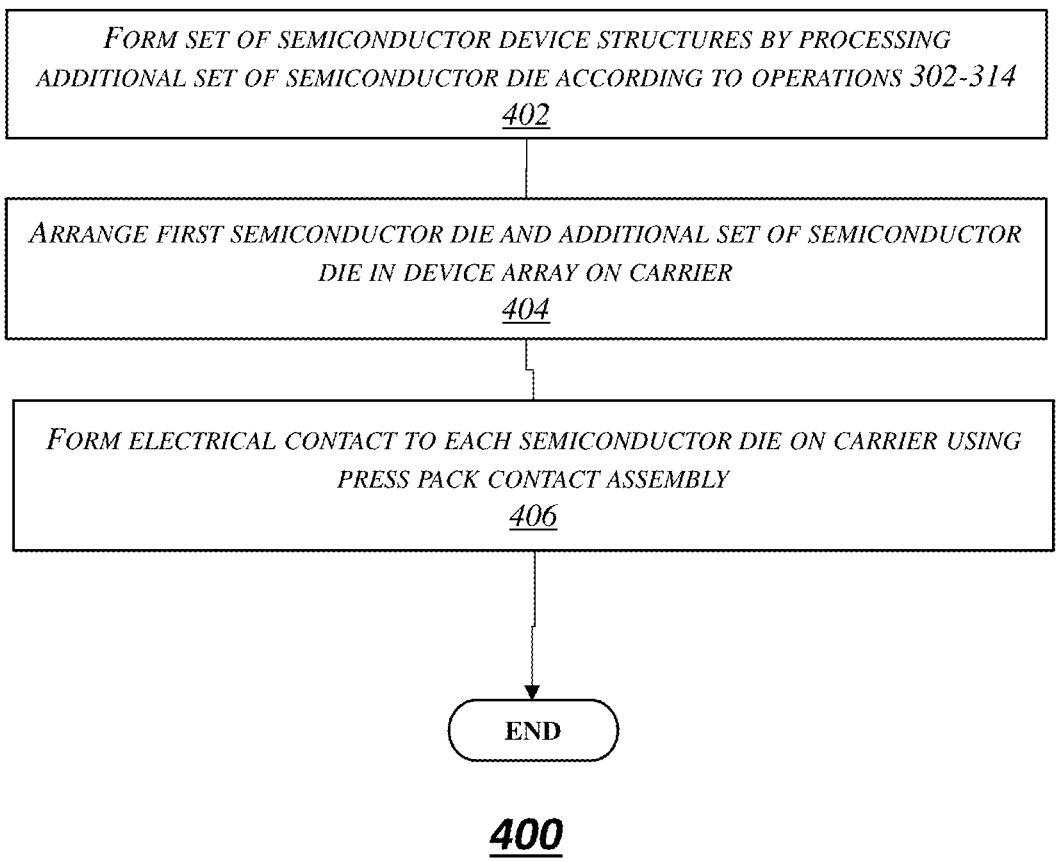
FIG. 4 depicts a first process flow, according to embodiments of the disclosure.

Turning to FIG. 4 there is shown another process flow 400 according to additional embodiments of the disclosure.

At block 402, a set of semiconductor device structures is formed by processing an additional set of semiconductor die according to the operations of 302-314, discussed above with respect to FIG. 3. In some embodiments, the first semiconductor die and additional set of semiconductor die may be arranged within a common semiconductor substrate and may be processed simultaneously according to the operations of blocks 302-314. In other words, the first semiconductor die and additional set of semiconductor die may be arranged as separate regions in a semiconductor wafer, not yet diced into separate die. As such, a common set of semiconductor devices having the same structure may be formed in different regions of a semiconductor wafer, before separation into separate semiconductor die.

At block 404, the first semiconductor die and additional set of semiconductor die (now singulated) are arranged in device array on a common carrier, such as a carrier as known in the art. In some examples, the device array may include up to several dozens of die.

At block 406, electrical contact is formed to each semiconductor die on the carrier using press pack contact assembly. As such, the different die of the device array will collectively contribute to the overall properties of press-pack assembly.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A semiconductor device assembly, comprising:
   a device carrier;
   a plurality of semiconductor substrates, arranged in an array on a surface of the device carrier, wherein a given semiconductor substrate of the plurality of semiconductor substrates comprises:
      a semiconductor device, disposed at least in part within the given semiconductor substrate;
      a first insulator layer, disposed on a surface of the semiconductor device, and comprising a first contact aperture, disposed within the first insulator layer;
      a first contact layer, comprising a first electrically conductive material, disposed over the first insulator layer, and being in electrical contact with the semiconductor device through the first contact aperture;
      a second insulator layer, disposed over the first contact layer, wherein the second insulator layer further includes a second contact aperture, displaced laterally from the first contact aperture, by a first distance; and
      a second contact layer, comprising a second electrically conductive material, disposed over the second insulator layer, wherein the second contact layer is electrically connected to the semiconductor device through the first contact aperture and the second contact aperture; and
   an external contacting device, arranged to electrically connect to the plurality of semiconductor substrates and further comprising:
      a conductive plate; and
      a plurality of contact pillars, electrically connected to the conductive plate:
   a plurality of first metal inserts, disposed between the plurality of semiconductor substrates and the plurality of contact pillars; and
   a plurality of second metal inserts, disposed between the plurality of semiconductor substrates and the device carrier.

2. The semiconductor device assembly of claim 1, the semiconductor device comprising an insulated gate bipolar transistor, a metal oxide semiconductor field effect transistor, or a semiconductor diode.

3. The semiconductor device assembly of claim 1, the first insulator layer comprising silicon oxide, a doped silicon glass, or a multilayer stack, and the second insulator layer comprising silicon nitride.

4. The semiconductor device assembly of claim 1, the first contact layer comprising an AlSi alloy or AlSiCu alloy having a first layer thickness in a range of 2 µm to 6 µm, and the second contact layer comprising an aluminum layer having a second layer thickness in a range of 4 µm to 15 µm.

5. The semiconductor device assembly of claim 1, the first insulator layer comprising a plurality of lower contact apertures, including the first contact aperture, the plurality of lower contact apertures arranged as a first plurality of contact stripes having a long direction arranged in a first direction, the second insulator layer comprising a plurality of upper contact apertures, including the first contact aperture, the plurality of upper contact apertures arranged as a second plurality of contact stripes having a long direction arranged in the first direction.

6. The semiconductor device assembly of claim 5, wherein the plurality of upper contact apertures are displaced laterally from the plurality of lower contact apertures by a predetermined distance.

7. The semiconductor device assembly of claim 1, wherein the first distance is in a range of 10 µm to 50 µm.

8. The semiconductor device assembly of claim 1, wherein the semiconductor device of the plurality of semiconductor substrates is an insulated gate bipolar transistor (IGBT), wherein the external contacting device is electrically connected to an emitter terminal of the IGBT of the plurality of semiconductor substrates, and wherein a collector terminal of the IGBT of the plurality of semiconductor substrates is connected to the device carrier.

9. A method of forming a semiconductor device assembly, comprising:
   depositing a first insulator layer on an active region of at least one semiconductor device, the at least one semiconductor device disposed at least partially within a semiconductor substrate;
   patterning the first insulator layer to form a set of first apertures, over the active region;
   forming a first contact layer on the first insulator layer, wherein the first contact layer is electrically connected to the active region via the set of first apertures;
   forming a second insulator layer over the first contact layer;
   patterning the second insulator layer to form a set of second apertures, laterally displaced from the set of first apertures; and
   forming a second contact layer on the second insulator layer, wherein the second contact layer is electrically connected to the active region of the at least one semiconductor device via the set of first apertures and the set of second apertures;
   wherein the at least one semiconductor device comprises a plurality of semiconductor devices, disposed within a plurality of semiconductor substrates, respectively, the method further comprising:
   arranging a first side of the plurality of semiconductor substrates to electrically connect to a conductive carrier; and
   arranging a second side of the plurality of semiconductor substrates to form a press pack connection to an external contacting device, the external contacting device comprising:
   a conductive plate; and
   a plurality of contact pillars, electrically connected to the conductive plate, wherein the plurality of contact pillars are arranged to clamp to the plurality of semiconductor substrates.

* * * * *